United States Patent [19] [11] 4,053,794
Edwards [45] Oct. 11, 1977

[54] SEMICONDUCTOR LOGIC GATES
[75] Inventor: Colin Raymond Edwards, Frome, Somerset, England
[73] Assignee: Texas Instruments Incorporated, Dallas, Tex.
[21] Appl. No.: 633,182
[22] Filed: Nov. 19, 1975

[30] Foreign Application Priority Data
Nov. 21, 1974  United Kingdom ............... 50528/74
[51] Int. Cl.² .................. H03K 19/08; H03K 19/12; H03K 19/32; H03K 19/20
[52] U.S. Cl. .................................. 307/216; 307/205; 307/207; 307/213; 307/299 A; 307/317 A
[58] Field of Search ............... 307/205, 216, 215, 218, 307/299 A, 317 A, 213, 207

[56] References Cited
U.S. PATENT DOCUMENTS

| 2,850,647 | 9/1958 | Fleisher | 307/216 |
|---|---|---|---|
| 3,252,011 | 5/1966 | Zuk | 307/216 X |
| 3,512,009 | 5/1970 | Batte | 307/216 |
| 3,515,901 | 6/1970 | White | 307/205 X |
| 3,518,458 | 6/1970 | Camenzind | 307/299 A X |
| 3,694,666 | 9/1972 | Briley | 307/299 A X |
| 3,829,718 | 8/1974 | Hart | 307/304 |

FOREIGN PATENT DOCUMENTS
873,500  7/1961  United Kingdom ................ 307/216

OTHER PUBLICATIONS
Harper, "Inverter Speed-Up;" *IBM Tech. Discl. Bull.;* vol. 12, No. 4, p. 537; Sept. 1969.
Villejoubert, "Exclusive-or Circuit;" *IBM Tech. Discl. Bull.;* vol. 12, No. 9, p. 1469; Feb. 1970.

Primary Examiner—John S. Heyman
Assistant Examiner—Larry N. Anagnos
Attorney, Agent, or Firm—Harold Levine; Gary C. Honeycutt; James T. Comfort

[57] ABSTRACT

A logic gate using a single transistor having two emitters interconnected by a resistor which is center-tapped to the transistor base. The collector is connected through a load resistor to the DC supply rail.

A logic gate using a pair of IGFETS having sources connected together, the drains connected through a common resistor to a DC supply rail. The gates are connected through diodes to the common sources of the channels.

Various logic gate functions, including EXCLUSIVE-OR and EXCLUSIVE-NOR functions based on these gates.

19 Claims, 13 Drawing Figures

SEMICONDUCTOR LOGIC GATES

This invention relates to improved circuit arrangements for semiconductor logic gates.

Semiconductor logic gates are the building blocks used to provide digital integrated circuits capable of performing computing functions. It is desirable to use as small an area as possible of semiconductor chip for an integrated circuit partly because of the cost of the material and partly to improve the yield, so that the integrated circuit function is to some extent limited by the number of logic gates the chip can accommodate. It is therefore desirable to reduce the number of components required for each logic gate provided that this also results in a reduction in the area occupied by each logic gate. The area occupied by a logic gate depends not only on the number of components in it but also on the type of components. For instance, a single resistor may occupy a greater area than several diodes or transistors, and may not represent a saving in chip area over two diodes.

There are other considerations which influence the choice of logic gates to be used in an integrated circuit. Such considerations include maximum operating speed, power dissipation and immunity to noise. Therefore, there is a continuing need for novel circuit configurations for semiconductor logic gates which provide advantages in at least one direction, even though there may be attendant disadvantages.

It is an object of the present invention to provide a novel semiconductor logic gate.

According to the invention there is provided a semiconductor logic gate including at least one transistor arrangement having a first input terminal, at least two further input terminals and an output terminal, the arrangement being such that the current through the output terminal is dependent on the potential difference between the first and each of the further input terminals, at least two input signal paths connected to the further input terminals, separate direct current paths from the first input terminal to each of the further input terminals such that the potential at the first input terminal is dependent on the potentials at the further input terminals but there is no effective signal path between the further input terminals, and at least one output circuit connected to the output terminal for responding to the current therethrough.

A suitable transistor arrangement may comprise a bipolar transistor having two emitter electrodes providing two further input terminals and a base electrode providing the first input terminal, the direct current paths between the first input terminal and each of the further input terminals being provided by diodes, and the transistor collector providing an output terminal.

Another transistor arrangement may comprise a bipolar transistor having three emitter electrodes providing three further input terminals and a base electrode providing the first input terminal, the direct current paths between the first input terminal and each of the further input terminals being provided by diodes, and the transistor collector providing an output terminal.

The direct current paths may alternatively be provided by resistors or resistors in combination with diodes.

An alternative transistor arrangement may be provided by two insulated gate field effect transistors (IGFET) with their source electrodes connected together to provide the first input terminal, and the gate electrodes providing two further input terminals, the direct current paths between the first input terminal and each of the further input terminals being provided by diodes and the drain electrodes connected together to provide an output terminal.

Another insulated gate field effect transistor arrangement may be provided by three insulated gate field effect transistors with their source electrodes connected together to provide the first input terminal, and the gate electrodes providing three further input terminals, the direct current paths between the first input terminal and each of the further input terminals being provided by diodes, and the drain electrodes connected together to provide an output terminal.

The insulated gate field effect transistors may be metal oxide silicon field effect transistors (MOSFET).

A logic gate may be provided by a single bipolar transistor in which case the first input terminal of the transistor remains as an internal connection, the input ports of the logic gate being provided by the further input terminals and the output port of the logic gate being provided by the output terminal of the transistor.

In a logic gate employing a bipolar transistor arrangement the input terminals connected to the emitter electrodes provide the input ports to the logic gate and the output terminal connected to the collector electrode provides the output port of the logic gate.

In a logic gate employing MOS field effect transistors the input terminals connected to the gate electrodes provide the input ports to the logic gate and the output terminals connected to the drain electrodes provides the output port of the logic gate.

This transistor arrangement provides the advantage of high immunity to noise at the inputs to logic gates when these are connected in parallel to fabricate complex logic functions.

When semiconductor diodes provide the direct current paths between the first input terminal and the further input terminals they may be p-n junction diodes or Schottky diodes. In a transistor arrangement using bipolar transistors, a resistor and a diode may be used in series to increase the fan-in of the resulting logic gate.

A single bipolar transistor arrangement using an n-p-n bipolar transistor with two emitters and having substantially indentical resistors or diodes connected between the first input terminal and the other input terminals of the arrangement, provides a logic gate performing the EXCLUSIVE-NOR function when the collector electrode provides the output terminal of the transistor arrangement, and hence the output port of the logic gate, the output port being referenced to the positive supply of the gate. Alternatively, an EXCLUSIVE-OR gate may be fabricated using a p-n-p transistor with two emitters and having substantially identical resistors or diodes connected between the first input terminal and the further input terminals of the arrangement, the collector electrode providing the output terminal of the transistor arrangement, and hence the output port of the logic gate, the output port being referenced to the negative supply of the gate.

A MOS field effect transistor arrangement of two P-channel MOS transistors with the source electrodes connected together to provide the first input terminal which is connected to the further input terminal via substantially identical diodes, provides an EXCLUSIVE-OR logic gate when the drain electrodes provide the output terminal of the transistor arrangement and hence the output port of the logic gate, the output port of the logic gate being referenced to the negative supply of the gate. Alternatively, an EXCLUSIVE-NOR gate may be fabricated using two N- Channel MOS transistors with the source electrodes connected together to provide the first input terminal which is connected to the further input terminals via substantially identical diodes, when the connected drain electrodes of the transistors provide the output terminal of the transistor arrangement and hence the output port of the logic gate, the output port of the logic gate being referenced to the positive supply of the gate.

Semiconductor logic gates in accordance with the invention will now be described by way of example only and with reference to the accompanying drawings, in which.

Figure 1A:
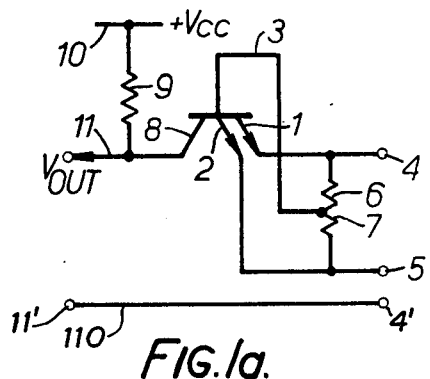
FIG. 1a represents an EXCLUSIVE-NOR gate implemented by a single n-p-n bipolar transistor and resistors.

Operation of the basic logic gate employing one n-p-n bipolar transistor arrangement can be understood by reference to FIG. 1a. A first input terminal 3 is provided by the base electrode of the transistor and two further input terminals 1 and 2 are provided by the two emitter electrodes of the transistor. The path between the first input terminal 3 and the input terminal 1 is provided by the resistor 6 and the path between the first input terminal 3 and the input terminal 2 is provided by the resistor 7. The collector electrode is connected to the positive potential side 10 of an electrical power supply via a resistor 9, the negative potential side of the electrical power supply being connected to a reference line 110. The output terminal 11 of the logic gate is connected to the collector electrode, the output port of the logic gate being provided by the terminal pair 11-11' and the input ports of the logic gate being provided by the terminal pairs 4-4' and 5-4', the terminals 4' and 11' being provided by the reference line 110. The resistor 9 acts as the output circuit in this arrangement.

Figure 8:
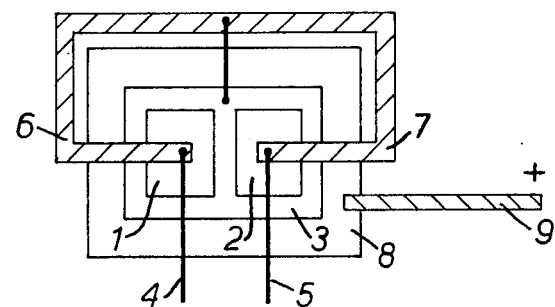
FIG. 8 represents a circuit fabrication of the gate shown in FIG. 1.

FIG. 8 shows a fabrication of the arrangement of FIG. 1 on a semiconductor slice. A planar transistor with double emitters 1 and 2 is used, the resistors 6 and 7 being provided by a single centretapped linear resistor between the emitters. The resistor 9 is formed also as a linear resistor.

In operation, logic inputs are provided on the input ports 4-4' and 5-4'. If there is a positive potential across input port 4-4' and zero potential across input port 5-4', current flow can proceed into terminal 4 through resistor 6 into input terminal to the base electrode and then out of the emitter electrode 2 that leads to terminal 5. This turns the transistor on, causing a low potential across output port 11-11' becase of the voltage drop across resistor 9. Reversal of the potentials across ports 4-4' and 5-4'causes current flow terminal 5, through resistor 7 to input terminal 3 and to the base electrode, and out of the emitter electrode 1 connected to terminal 4. This again causes low potential across output port 11-11'. If the potentials across both ports 4-4' and 5-4' are high, no current can flow into the base electrode via input terminal 3 and output port 11-11' remains high. The same condition obtains when the potentials across both input ports 4-4' and 5-4' are low. The logic gate represented by FIG. 1a therefore performs the EXCLUSIVE-NOR function. The resistors 6 and 7 permit the flow of current between input terminals 4 and 5, this current contributing nothing to the logic operation, i.e. there is no effective signal path between these terminals.

Figure 1B:
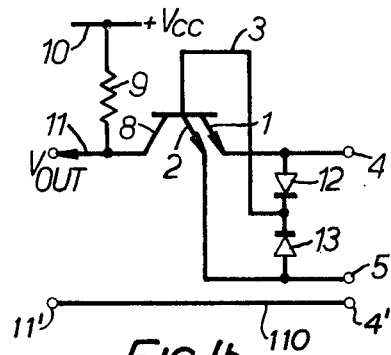
FIG. 1b represents an EXCLUSIVE-NOR gate implemented by a single n-p-n bipolar transistor, resistor and diodes.

FIG. 1b shows an alternative form of logic gate employing one n-p-n bipolar transistor and also performing the EXCLUSIVE-NOR function. The presence of diodes 12 and 13 placed "back-to-back" between the input terminals 4 and 5 prevents the flow of current between the input terminals 4 and 5. The operation of this logic gate is similar to that of FIG. 1a in other respects.

Figure 1C:
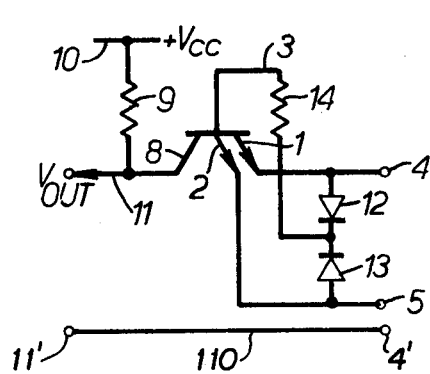
FIG. 1c represents an EXCLUSIVE-NOR gate implemented by a single n-p-n bipolar transistor, resistors and diodes.

FIG. 1c shows a modification of FIG. 1b in that a resistor 14 is introduced into the input terminal 3 of the transistor arrangement. This has the effect of reducing the currents accepted at the input terminals 4 and 5, reducing loading by the logic gates.

Figure 2:
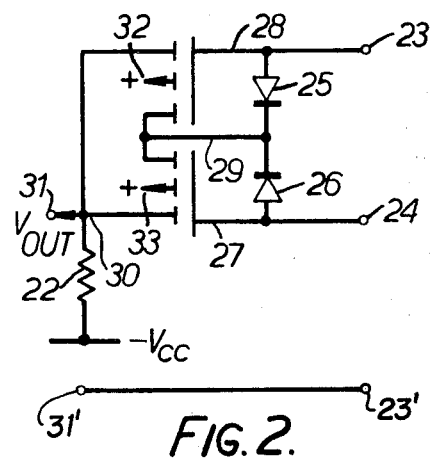
FIG. 2 represents an EXCLUSIVE-OR gate implemented by two P-Channel MOS transistors and diodes.

A logic gate may be implemented by two MOS field effect transistors 32, 33 as shown in FIG. 2, where P-channel devices provide an EXCLUSIVE-OR gate. The transistor arrangement results from connecting together the source electrodes of the transistors to provide a first input terminal 29 and connecting together the drain electrodes of the transistors to provide an output terminal 30. Further input terminals 27 and 28 are provided by the gate electrodes of the transistors. The input terminals 27 and 28 of the transistor arrangement are connected to the first input terminal 29 of the transistor arrangement via diodes 26 and 25. In operation, with a positive potential applied across input port 23-23' and zero potential applied across input port 24-23' of the logic gate, diode 25 will be forward biassed and diode 25 reverse biassed. The gate electrode of transistor 32 will therefore be positive with respect to its source electrode by an amount determined by the diode 25, so that transistor 32 is biassed off. On the other hand the gate electrode of transistor 33 will be negative with respect to its source electrode and transistor 33 will be biassed on. This establishes a conduction path from input terminal 23, through diode 25 and transistor 33, causing the potential across output port 31-31' to be positive or logically high. If the input potentials are reversed then transistor 32 is on, transistor 33 is off and the potential at output port 31-31' is again high. If both inputs are positive then both gate electrodes are at substantially the same potential as the source electrodes, both transistors are off and the potential across output port 31-31' is low. If both inputs are zero the potential across output port 31-31' is again low. It can be seen that this situation represents the EXCLUSIVE-OR function. An EXCLUSIVE-NOR gate would be provided by using N-channel MOS transistors and reversing the polarities of the diodes.

Figure 3:
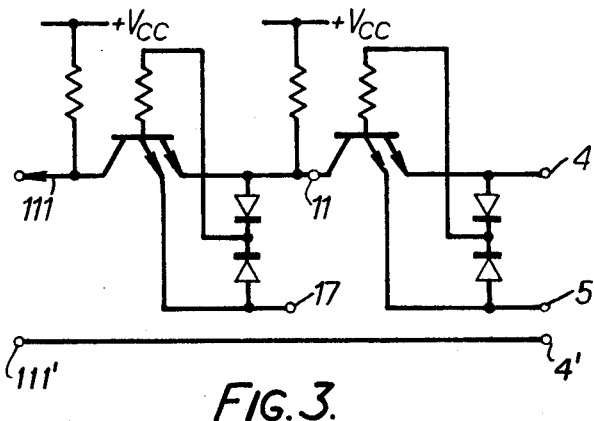
FIG. 3 represents a cascade of two EXCLUSIVE-NOR gates.

Referring to FIG. 3, the logic function performed by the cascade of EXCLUSIVE-NOR gates can be determined by considering logical inputs A and B to input ports 4-4' and 5-4' respectively, and logical input C to input port 17-4'. The logical output at output port 111-111' will be high when the logical inputs to ports 11-4' and 17-4' are both high or both low. The low logical input to port 17-4' can be represented by $\overline{C}$, and the logical input to port 11-4' is low for $A\overline{B} + \overline{A}B$ present at input ports 4-4' and 5-4' and high for $A.B + \overline{A}.\overline{B}$. If D represents the overall logic function from the gate, then the logic function of the gate $$D = \overline{A}.\overline{B}.C + \overline{A}.B.\overline{C} + A.\overline{B}.\overline{C} + A.B.C$$

Figure 4A:
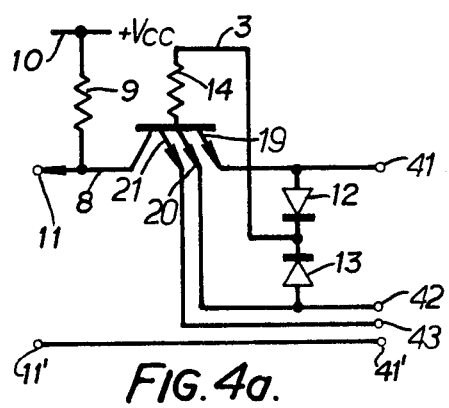
FIG. 4a represents a modification of the basic gate using a bipolar transistor, the modification being the provision of a third input port to the logic gate.
Figure 4B:
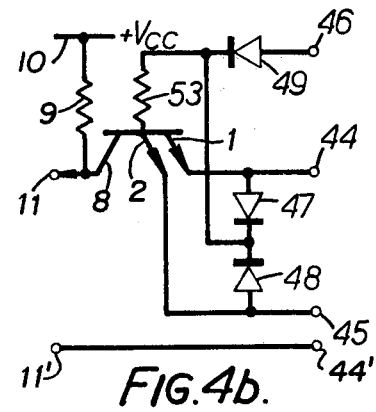
FIG. 4b represents another modification of a bipolar transistor arrangement giving a logic gate with three input ports.

Referring now to FIG. 4a, the logic circuit includes a transistor having three emitters 19, 20 and 21 connected to input terminals 41, 42 and 43, respectively and emitters 19 and 20 being connected by diodes 12 and 13 to a common resistor 14 connected to the base of the transistor, as in FIG. 1c. It can be seen that the logical output at the output port 11-11' will be high when all three inputs 41, 42 and 43 are high, and again when both inputs to ports 41-41' and 42-41' are low, exclusive of the input to port 43-41'. If the output at port 11-11' is regarded as D and the inputs to ports 41-41', 42-41' and 43-41' are A, B and C respectively, then the logic gate performs the function $D = A.B.C + \overline{A}.\overline{B}$ FIG. 4b shows an arrangement similar to that shown in FIG. 1c, except that an input terminal 46 is connected by a diode 49 and resistor 14 to the base of the transistor. This circuit performs, the logic function $D = \overline{A}.\overline{B}.\overline{C} + A.B$ where D is the output at port 11-11' and A, B and C are the inputs to ports 44-44', 45-44' and 46-44' respectively. When the inputs to ports 44-44' and 45-44' are both high, the output D remains high irrespective of the logic input to port 46-44'. When all inputs A, B and C are low the output D is again high. The output D is low for all other input combinations.

Figure 5:
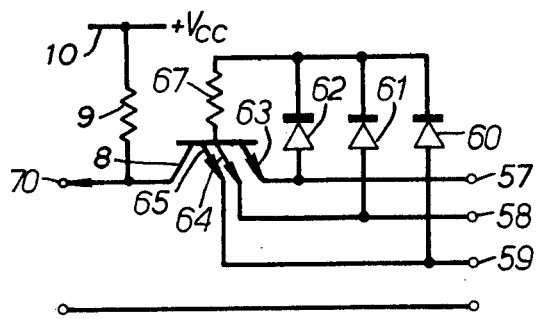
FIG. 5 represents a logic gate implemented by a single bipolar transistor with three emitter electrodes and diodes connecting each input terminal to the base electrode via a series resistor.

The logic gate of FIG. 5 performs the logic function $D = A.B.C + \overline{A}.\overline{B}.\overline{C}$ where D represents the output value and A, B and C are the input values to ports 57-57', 58-57' and 59-57' respectively. The output is high when all inputs are high and when all inputs are low. All other combinations result in a low output.

Figure 6:
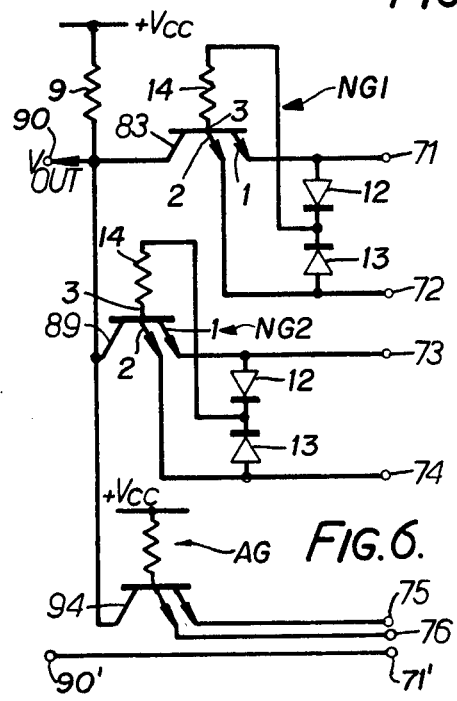
FIG. 6 represents composite logic gate suitable for fabrication in a common collector region, the composite logic gate comprising a conventional AND gate and two bipolar EXCLUSIVE-NOR gate according to the invention.

The logic gate represented by FIG. 6 performs an AND operation on the outputs of two EXCLUSIVE-NOR gates NG1 and NG2 (of the type shown in FIG. 1C) and a conventional two-input AND gate AG comprising dual emitter transistor Q1. Gates NG1 and NG2 have input terminals 71, 72 and 73, 74 and output terminals 83 and 89 while the gate AG has input terminals 75, 76 and an output terminal 94. The output terminals 83, 89 and 94 are connected to a common output 90 at which the logic output G from the overall gate appears. Considering the inputs to ports 71-71' and 72-71' to be A and B, the inputs to ports 73-71' and 74-71' to be C and D, and the inputs to ports 75-71' and 76-71' to be E and F, the output G at the output port 90-90 must then be expressed as $G = (A.B + \overline{A}.\overline{B}).(C.D + \overline{C}.\overline{D}).(E.F)$ which represents the combinations which cause a high output from the logic gate.

Figure 7:
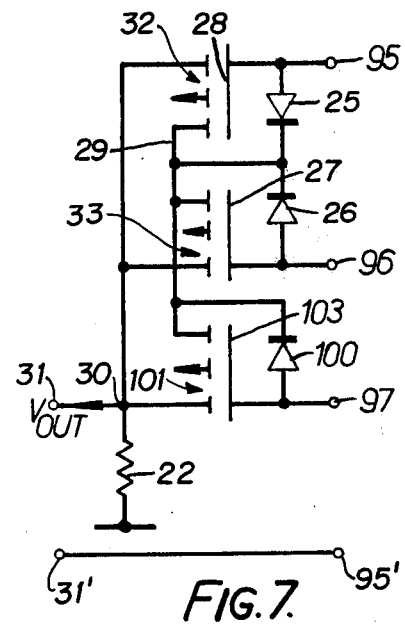
FIG. 7 represents a logic gate implemented by three P-channel MOS transistors and diodes connecting each input terminal to connected source electrodes.

The gate shown in FIG. 7 includes three IGFET's, two connected in the configuration shown in FIG. 2. The third transistor 101 has a source connected to the sources of transistors 32 and 33, a gate 103 connected to an input terminal 97 and a drain connected to the common output terminal 30. A diode 100 connects the gate 103 to the source of transistor 101;

The logic function performed by the gate shown in FIG. 7 can be expressed as $D = A.\overline{B} + \overline{A}.B + A.\overline{C} + \overline{A}.C$, where A, B and C are the logic inputs to ports 95-95', 96-95' and 97-95' respectively and D is the output value at the output port 31-31'. It can be seen that the output will be low under two conditions, firstly when all inputs are low and secondly when all inputs are high. Under all other combinations, at least one input will be high, causing the common source electrodes 29 to be high, and at least one input will be low causing one of the gate electrodes to be low. The or each transistor with a low input to its gate electrode will then conduct, causing the output to be high.

Figures 9, 10:
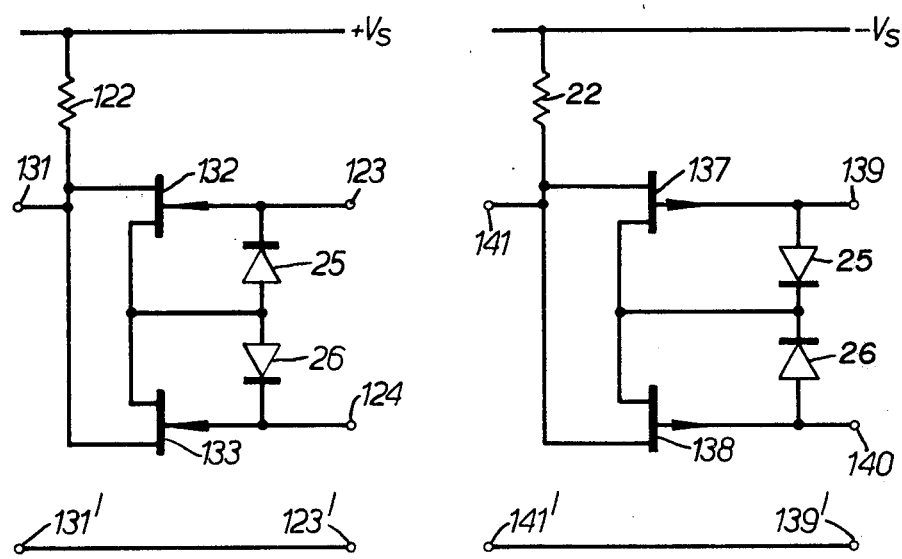
FIG. 9 represents an EXCLUSIVE-NOR gate implemented by means of N-channel junction field effect transistors.
FIG. 10 represents an EXCLUSIVE-OR gate implemented by means of P-channel junction field effect transistors.

The logic gate shown in FIG. 9 is based on that shown in FIG. 2 but uses N-channel JFET's 132 and 133, with the diodes 25 and 26 reversed in polarity from that shown in FIG. 2. An output is provided across output port 131-131' that is high when the signals to input ports 123-123' and 124-123' are both high or both low, and an output that is low when the input signals are logical complements. Therefore the logic gate performs the EXCLUSIVE-NOR function.

FIG 10 is the EXCLUSIVE-OR form of the junction field effect transistor gate employing P-channel devices 137 and 138. Note that here the diodes 25 and 26 are poled the same as in FIG. 2. Here the output across port 141-141' is low when the input signals to ports 139-139' and 140-139' are the same, and the output is high when the inputs are complementary.

It will be noted that in FIG. 10, when transistor 137 is conducting and transistor 138 is not conducting, the load current flows from the power supply through resistor 22, transistor 137, diode 26 and must also flow through the source resistance across input port 140-139'. Therefore for satisfactory operation the current through resistor 22 must be determined mainly by resist 140, which indicates that the source resistance must be small compared with resistor 22. This condition applies to all forms of the invention irrespective of which type of active device is used.

What is claimed is:

1. An integrated TTL compatible semiconductor logic gate including at least one multi-emitter NPN transistor including a base terminal and first and second emitters defining respective signal input terminals, means for causing a potential difference between said emitters only in response to logic signals of different logic levels at both of said input terminals and comprising separate direct current paths from said emitters to said base terminal with no functionally effective signal paths between said emitters and said transistor having a collector connected to an output terminal for said logic gate.

2. A logic gate according to claim 1, wherein said direct current paths from said first and second emitters to said base terminal are provided by semiconductor diodes.

3. A logic gate according to claim 2, wherein said semiconductor diodes are PN junction diodes.

4. A logic gate according to claim 2, wherein said semiconductor diodes are metal-semiconductor junction diodes.

5. A logic gate according to claim 2, wherein said diodes have a common connection connected by a resistor to said base terminal.

6. A semiconductor logic gate according to claim 1, wherein the direct current paths between said emitters and said base terminal are provided by an integrated resistive path connected between said first and second emitters and having a tap connected to said base terminal.

7. A logic gate according to claim 1, further including a common resistor connecting said direct current paths to said base terminal.

8. A logic gate according to claim 1, wherein said transistor includes a third emitter connected to a further input terminal.

9. A semiconductor logic gate including at least two field effect transistors having sources connected together to provide a first input terminal, gate electrodes providing two further input terminals, and respective drain electrodes, at least two input signal paths connected to said further input terminals, separate direct current paths from the first input terminal to each of the further input terminals for producing a potential input after the first input terminal dependent on the potentials at the further input terminals with no functionally effective signal path between the further input terminals, and means connecting said drain electrodes to a common output terminal for deriving an output from said logic gate in response to input signal levels present at said further input terminals.

10. A semiconductor logic gate as claimed in claim 9 wherein the direct current paths between the first input terminal and the further input terminals are provided by semiconductor diodes.

11. A semiconductor logic gate as claimed in claim 10 wherein the semiconductor diodes are p-n junction diodes.

12. A semiconductor logic gate as claimed in claim 10 wherein the semiconductor diodes are metal-semiconductor junction diodes.

13. A semiconductor logic gate as claimed in claim 9 wherein the direct current paths between the first input terminal and the further input terminals are provided by resistors.

14. A semiconductor logic gate as claimed in claim 9 wherein the field effect transistors are insulated gate field effect transistors.

15. A semiconductor logic gate as claimed in claim 14 wherein the field effect transistors are metaloxide-semiconductor field effect transistors.

16. An integrated TTL compatible semiconductor logic circuit including two logic gates each having at least one multi-emitter NPN transistor including a base terminal and first and second emitters defining respective signal input terminals, means for causing a potential difference between said emitters only in response to logic signals of different logic levels at both of said input terminals and comprising separate direct current paths from said emitters to said base terminal with no functionally effective signal paths between said emitters and said transistor having a collector connected to an output terminal for said logic gate; and wherein the output terminal of one of said logic gates is connected to one of the input terminals of the other logic gate.

17. An integrated TTL compatible semiconductor logic circuit including a plurality of logic gates each having at least one multi-emitter NPN transistor including a base terminal and first and second emitters defining respective signal input terminals, means for causing a potential difference between said emitters only in response to logic signals of different logic levels at both of said input terminals and comprising separate direct current paths from said emitters to said base terminal with no functionally effective signal paths between said emitters and said transistor having a collector connected to an output terminal for said logic gate; and means connecting the output terminal of each said logic gate to a common circuit output.

18. An integrated TTL compatible semiconductor logic gate including at least one multi-emitter NPN transistor including a base terminal and first and second emitters having terminals defining respective signal input terminals, means for causing a potential difference between said emitters only in response to logic signals of different logic levels at both of said input terminals and comprising first and second diodes having anodes connecting said first and second emitters respectively and having cathodes connected by a common resistor to said base terminal, a third input terminal connected by a third diode having a cathode connected to the cathodes of said first and second diodes, and said transistor having a collector connected to an output terminal for said logic gate.

19. A logic circuit having a semiconductor logic state including at least two field effect transistors having sources connected together to provide a first input terminal, gate electrodes providing two further input terminals, and respective drain electrodes, at least two input signal paths connected to said further input terminals, separate direct current paths from the first input terminal to each of the further input terminals for producing a potential input after the first input terminal dependent on the potentials at the further input terminals with no functionally effective signal path between the further input terminals, and means connecting said drain electrodes to a common output terminal for deriving an output from said logic gate in response to input signal levels present at said further input terminals; and a third field effect transistor having a source connected to the sources of said first and second transistors, a gate connected to an additional input terminal and by a direct current path to the source of said transistor; and means connecting the drain of said third transistor to said common output terminal.

* * * * *